(12) United States Patent
Nakamura et al.

(10) Patent No.: US 9,659,880 B2
(45) Date of Patent: May 23, 2017

(54) SEMICONDUCTOR DEVICE

(71) Applicant: Shinko Electric Industries Co., LTD., Nagano-ken (JP)

(72) Inventors: Manabu Nakamura, Nagano (JP); Yukio Shimizu, Nagano (JP); Nahomi Inoue, Nagano (JP)

(73) Assignee: Shinko Electric Industries Co., LTD., Nagano-Ken (JP)

(*) Notice: Subject to any disclaimer, the term of this patent is extended or adjusted under 35 U.S.C. 154(b) by 0 days.

(21) Appl. No.: 15/059,582

(22) Filed: Mar. 3, 2016

(65) Prior Publication Data
US 2016/0268215 A1 Sep. 15, 2016

(30) Foreign Application Priority Data
Mar. 11, 2015 (JP) .................. 2015-048316

(51) Int. Cl.
| | | |
|---|---|---|
| *H01L 23/552* | (2006.01) | |
| *H01L 23/367* | (2006.01) | |
| *H01L 23/373* | (2006.01) | |
| *H01L 23/42* | (2006.01) | |

(52) U.S. Cl.
CPC ........ *H01L 23/552* (2013.01); *H01L 23/3675* (2013.01); *H01L 23/3737* (2013.01); *H01L 23/42* (2013.01); *H01L 2224/13111* (2013.01); *H01L 2224/13116* (2013.01); *H01L 2224/13144* (2013.01); *H01L 2224/16227* (2013.01); *H01L 2224/48091* (2013.01); *H01L 2224/48247* (2013.01); *H01L 2924/15311* (2013.01); *H01L 2924/15333* (2013.01); *H01L 2924/1815* (2013.01); *H01L 2924/3025* (2013.01)

(58) Field of Classification Search
CPC .......... H01L 21/28079; H01L 21/4825; H01L 23/3114; H01L 23/345; H01L 23/488; H01L 23/4951; H01L 23/4952; H01L 23/532332; H01L 23/53219; H01L 24/85; H01L 27/222
USPC ....... 257/294, 296, 421, 422, 427, 449, 659, 257/678, 737, 782, 780
See application file for complete search history.

(56) References Cited

U.S. PATENT DOCUMENTS

| | | | | |
|---|---|---|---|---|
| 7,253,489 B2* | 8/2007 | Na | ......................... | G01R 33/05 257/421 |
| 8,298,963 B2* | 10/2012 | Akiba | .................... | B28D 5/022 257/773 |
| 9,030,841 B2* | 5/2015 | Arnold | .................. | H01L 23/552 361/818 |
| 9,146,348 B2* | 9/2015 | Nakashiba | ............... | G02B 6/12 |

(Continued)

FOREIGN PATENT DOCUMENTS

WO WO 2011/046091 A1 4/2011

*Primary Examiner* — Angel Roman
*Assistant Examiner* — Kevin Quinto
(74) *Attorney, Agent, or Firm* — Wolf, Greenfield & Sacks, P.C.

(57) ABSTRACT

A semiconductor device includes a wiring substrate, a semiconductor element mounted on an upper surface of a wiring substrate, and a magnetic shield arranged above the upper surface of the wiring substrate to cover an upper side of the semiconductor element. The magnetic shield is formed from a soft magnetic material and includes inclined faces that are inclined straight with respect to the upper surface of the wiring substrate at a portion overlapped with the semiconductor element in a plan view.

13 Claims, 11 Drawing Sheets

(56) References Cited

U.S. PATENT DOCUMENTS 9,349,940 B2* 5/2016 Goto .................. H01L 43/12
9,401,335 B2* 7/2016 Kasai ................. H01L 23/60

* cited by examiner

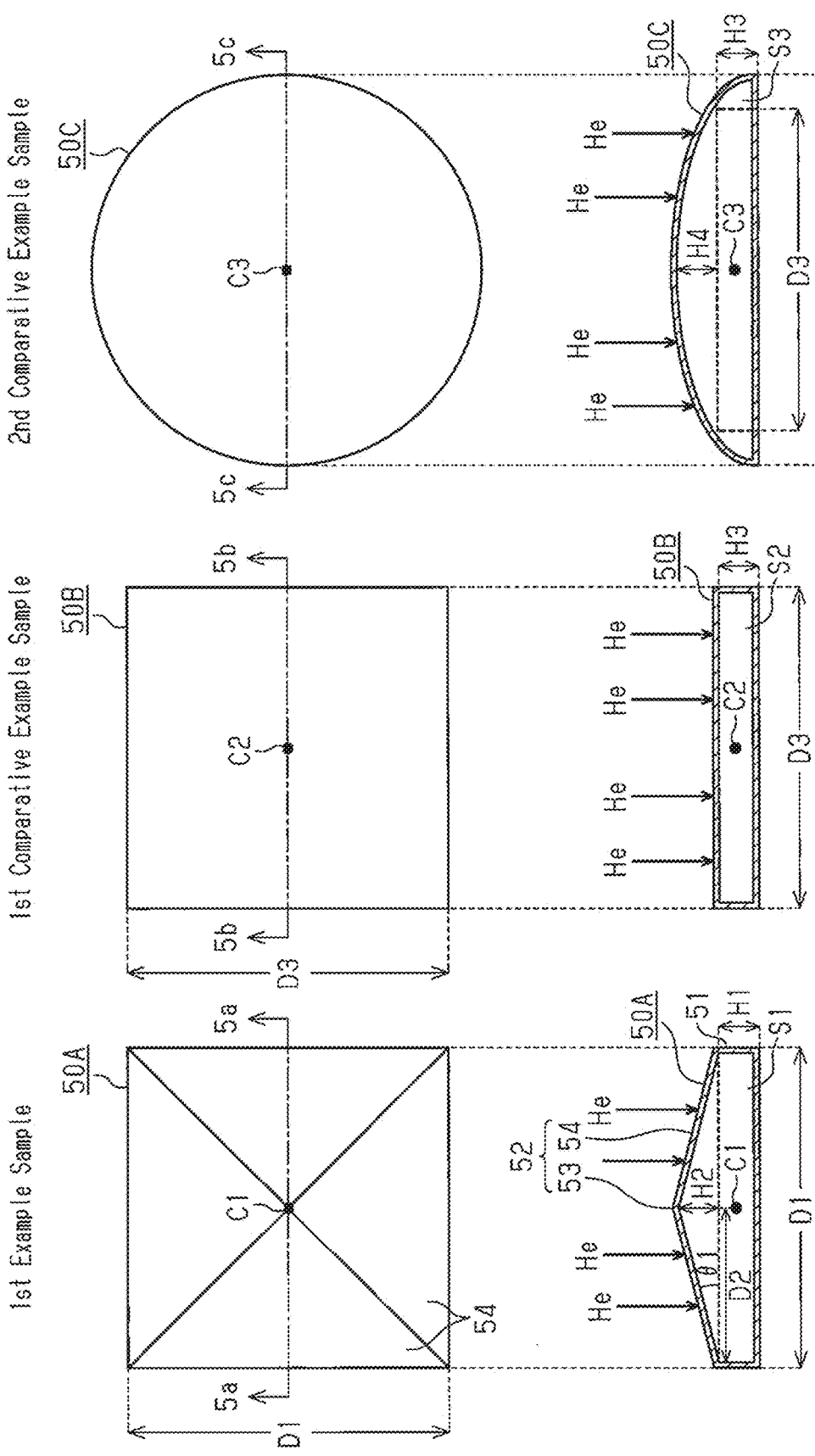

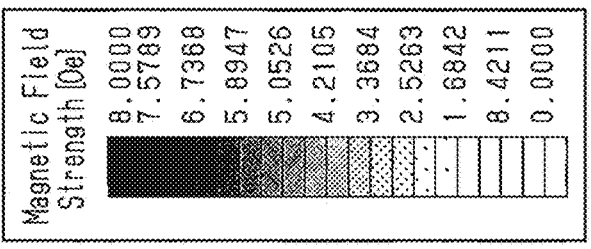
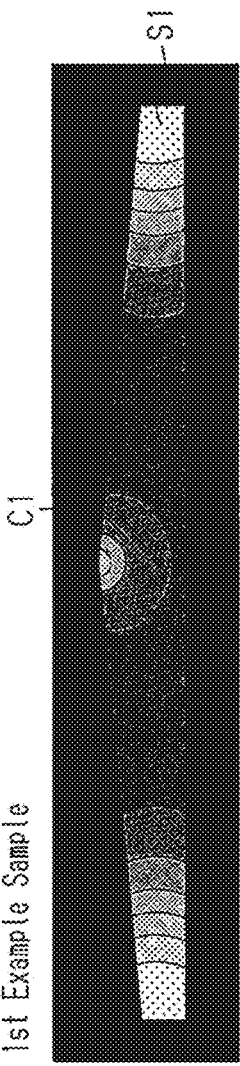
Fig.6A 1st Example Sample — Centroid Magnetic Field Strength=4.06×10² [A/m]
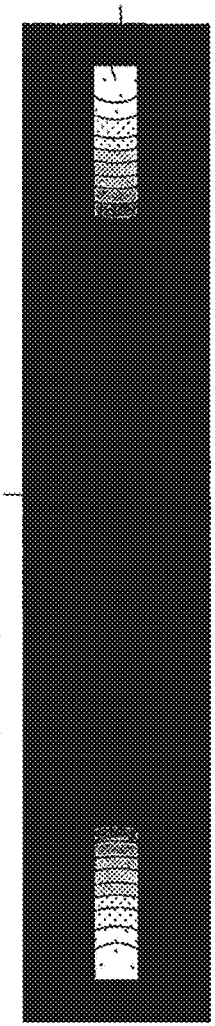
Fig.6B 1st Comparative Example Sample — Centroid Magnetic Field Strength=8.31×10² [A/m]
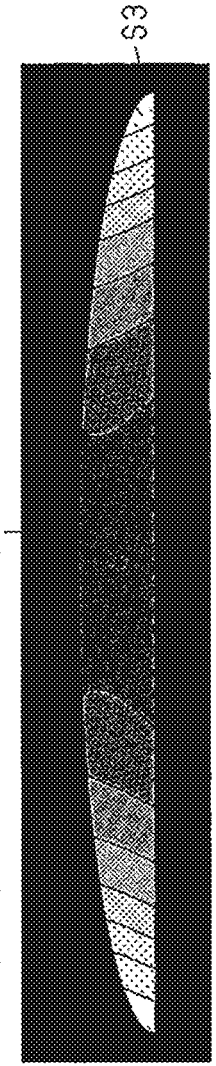
Fig.6C 2nd Comparative Example Sample — Centroid Magnetic Field Strength=4.89×10² [A/m]

Fig.10   2nd Example Sample
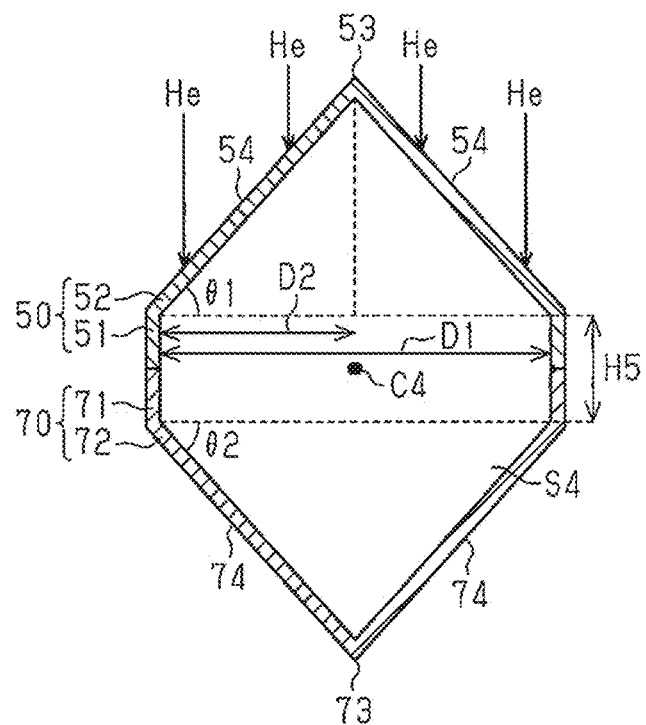
Fig.11
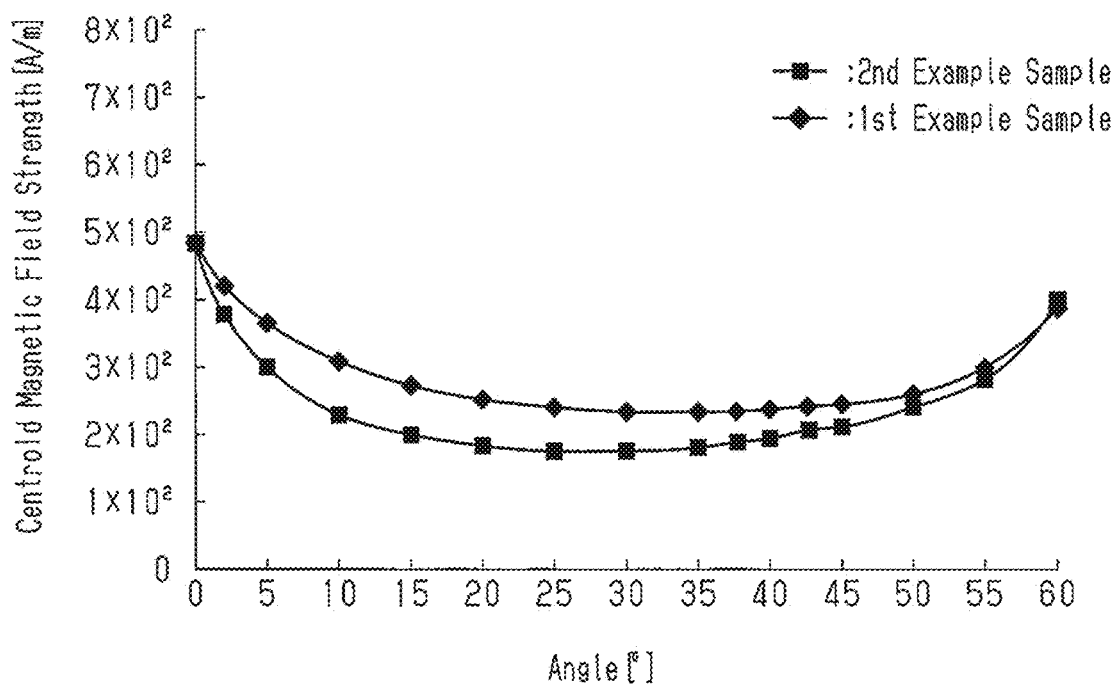

SEMICONDUCTOR DEVICE

CROSS-REFERENCE TO RELATED APPLICATIONS

This application is based upon and claims the benefit of priority from prior Japanese Patent Application No. 2015-048316, filed on Mar. 11, 2015, the entire contents of which are incorporated herein by reference.

FIELD

This disclosure relates to semiconductor devices.

BACKGROUND

A semiconductor device described in WO 2011/046091 includes a magnetic shield to protect a semiconductor element that is mounted on a wiring substrate from an external magnetic field. Such type of a magnetic shield, which is dome-shaped, covers the semiconductor element, from above and beside on the wiring substrate. The magnetic shield includes a curved portion that covers the upper side of the semiconductor elements. This improves the magnetic shielding effect as compared with when the surface of the magnetic shield covering the upper side of the semiconductor element is parallel to the semiconductor element.

SUMMARY

However, the magnetic shielding effect of the above magnetic shield is still insufficient. Thus, it is desired that the magnetic shielding effect be further improved.

One aspect of this disclosure is a semiconductor device including a wiring substrate, a semiconductor element mounted on an upper surface of a wiring substrate, and a magnetic shield arranged above the upper surface of the wiring substrate to cover an upper side of the semiconductor element. The magnetic shield is formed from a soft magnetic material. The magnetic shield includes inclined faces that are inclined straight with respect to the upper surface of the wiring substrate at a portion overlapped with the semiconductor element in a plan view.

Other aspects and advantages of this disclosure will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 5A is a schematic diagram illustrating the simulation conditions of a first example;

FIG. 5B is a schematic diagram illustrating the simulation conditions of a first comparative example;

FIG. 5C is a schematic diagram illustrating the simulation conditions of a second comparative example;

FIG. 6A is a schematic diagram illustrating the simulation results of the first example;

FIG. 6B is a schematic diagram illustrating the simulation results of the first comparative example;

FIG. 6C is a schematic diagram illustrating the simulation results of the second comparative example;

FIG. 10 is a schematic diagram illustrating the simulation conditions of the second example;

FIG. 11 is a graph illustrating the angle dependence of the magnetic shielding effect in the first and second examples;

DESCRIPTION OF THE EMBODIMENTS

Figure 1:
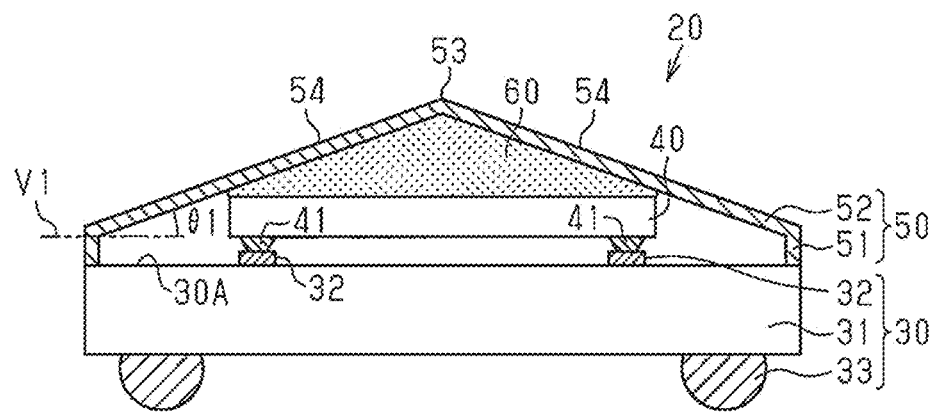
FIG. 1 is a schematic cross-sectional view illustrating one embodiment of a semiconductor device and taken along line 1-1 in FIG. 2.

One embodiment will now be described with reference to the drawings. In the drawings, elements are illustrated for simplicity and clarity and have not necessarily been drawn to scale. To facilitate understanding, hatching lines may not be illustrated or be replaced by shading in the cross-sectional drawings.

The structure of a semiconductor device 20 will now be described with reference to FIGS. 1 to 3. As illustrated in FIG. 1, the semiconductor device 20 includes a ball grid array (BGA) type wiring substrate 30, a semiconductor element 40 mounted on an upper surface of the wiring substrate 30, a magnetic shield 50 mounted on the upper surface of the wiring substrate 30, and a thermal conductor 60 thermally coupling the semiconductor element 40 and the magnetic shield 50.

The wiring substrate 30 includes a substrate body 31, connection pads 32, and solder balls 33. The substrate body 31 need only have an internal structure that electrically connects the connection pads 32 to the solder balls 33. For example, the substrate body 31 may include one or more wiring layers but does not need to include wiring layers. When the internal structure of the substrate body 31 includes two or more wiring layers, for example, two adjacent wiring layers are stacked with an interlayer insulation layer arranged in between. Vias extend through each wiring layer and each insulation layer to electrically connect the connection pads 32 and the solder balls 33. In this case, the substrate body may be a cored buildup substrate that includes a core substrate or a coreless substrate that does not include a core substrate. When the internal structure of the substrate body 31 does not include a wiring layer, for example, through electrodes extending through the substrate body 31 in the thickness-wise direction may be used to electrically connect the connection pads 32 and the solder balls 33.

The substrate body 31 (wiring substrate 30) may have any planar shape or any size. For example, the substrate body 31 may be square in a plan view. The substrate body 31 may have a size of, for example, approximately 30 mm×30 mm to 50 mm×50 mm in a plan view. In the present specification, the term "plan view" refers to a view of a subject taken in the vertical direction, and the term "planar shape" refers to the shape of a subject as viewed in the vertical direction.

The connection pads 32 are formed on the upper surface 30A of the substrate body 31 (wiring substrate 30). The connection pads 32 may be formed from copper (Cu) or copper alloy.

The solder balls 33 are formed on the lower surface of the substrate body 31. For example, the solder balls 33 are located on connection pads (not illustrated) formed on the lower surface of the substrate body 31. The solder balls 33 may be formed from, for example, an alloy including lead (Pb), an alloy of tin (Sn) and Cu, an alloy of Sn and silver (Ag), or an alloy of Sn, Ag, and Cu. The solder balls 33 function as external connection terminals connected to, for example, a motherboard or the like.

The semiconductor element 40 is, for example, flip-chip-mounted on the wiring substrate 30. More specifically, the semiconductor element 40 includes a circuit formation surface (lower surface) facing the upper surface 30A of the wiring substrate 30 and mounted faced down on the wiring substrate 30. For example, the semiconductor element 40 is electrically connected to the connection pads of the wiring substrate 30 by connection terminals 41 formed on the circuit formation surface. The circuit formation surface of the semiconductor element 40 is generally parallel to the upper surface 30A of the wiring substrate 30.

A memory chip such as a magnetic random access memory (MRAM) chip or a flash memory may be used as the semiconductor element 40. Alternatively, a magnetic resistance element or a logic circuit using a magnetic resistance element may be used as the semiconductor element 40. As another option, a logic chip such as a central processing unit (CPU) chip or a graphics processing unit (GPU) may be used as the semiconductor element. The semiconductor element 40 may have any planar shape or any size. The semiconductor element 40 may have a size of, for example, approximately 20 mm×20 mm to 30 mm×30 mm in a plan view.

For example, gold (Au) bumps or solder bumps may be used as the connection terminals 41. Solder bumps may be formed from an alloy including Pb, an alloy of Sn and Cu, an alloy of Sn and Ag, or an alloy of Sn, Ag, and Cu.

A magnetic shield 50 is mounted on the upper surface 30A of the wiring substrate 30 and covers the semiconductor element 40 from above and beside. The magnetic shield 50 has, for example, the form of a thin plate. Further, the magnetic shield 50 may have a thickness of, for example, approximately 50 μm to 5000 μm. The magnetic shield 50 may be formed from, for example, a soft magnetic material.

To improve the magnetic shielding effect, it is preferred that the soft magnetic material have a sufficiently high relative magnetic permeability (preferably, 500 or greater). Examples of such soft magnetic materials include iron, nickel, silicon steel, permalloy, ferrite, amorphous magnetic alloy, and nanocrystal magnetic alloy. Further, to improve heat dissipation, it is preferred that the soft magnetic material be electrically conductive.

The magnetic shield 50 is adhered with an adhesive agent (not illustrated) to the peripheral portion of the upper surface 30A of the wiring substrate 30 so as to encompass the semiconductor element 40. The magnetic shield 50 includes a frame 51 and a roof 52. The frame 51 has a bottom surface adhered to the upper surface 30A of the wiring substrate 30. The roof 52 is formed integrally with the frame 51. The roof 52 covers the upper side of the semiconductor element 40.

The frame 51 vertically projects, for example, toward the upper side from the rim of the upper surface 30A of the wiring substrate 30. Further, the frame 51, for example, partially covers the side surfaces of the semiconductor element 40.

Figure 2:
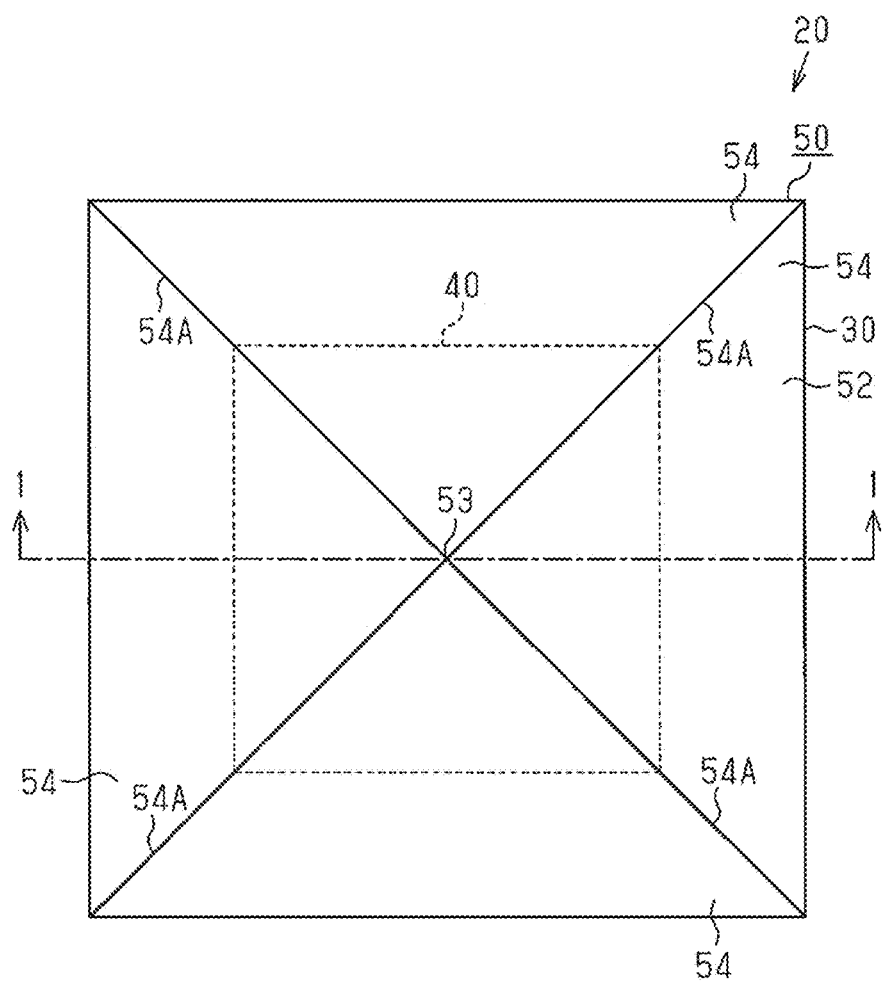
FIG. 2 is a schematic plan view illustrating the semiconductor device of FIG. 1.
Figure 3:
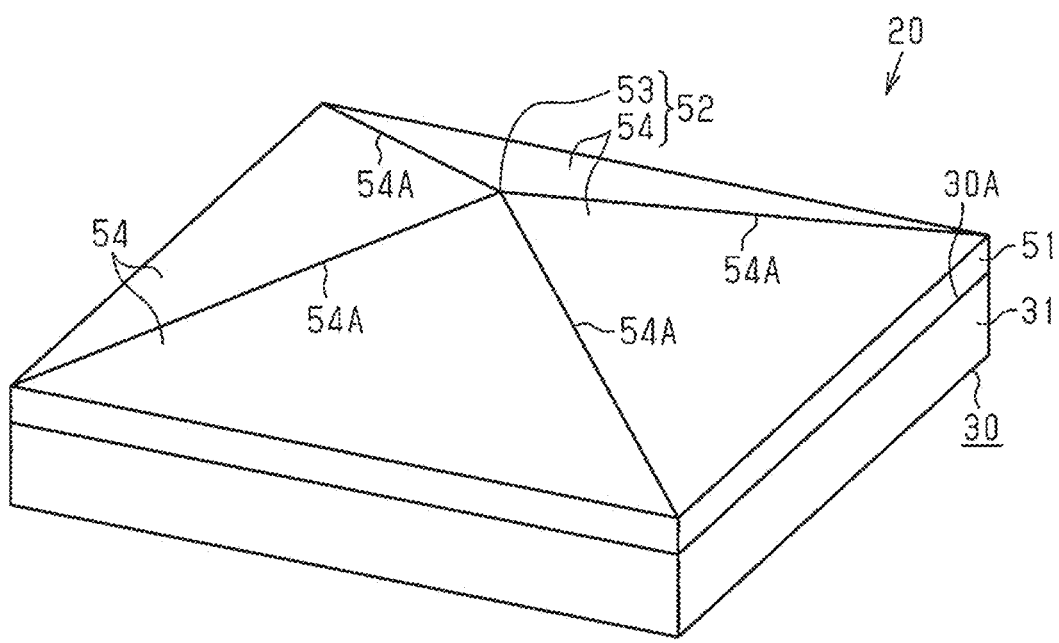
FIG. 3 is a schematic perspective view illustrating the semiconductor device of FIG. 1.

As illustrated in FIGS. 2 and 3, the roof 52 has the form of a square pyramid or square roofing. For example, the roof 52 includes an apex 53 and four inclined faces 54. The apex 53 is located upward from the upper end of the frame 51 at a position non-overlapped with the frame 51 in a plan view. For example, the apex 53 is located at a position overlapped with the centroid of the upper surface 30A of the wiring substrate 30 in a plan view. The four inclined faces 54 are inclined straight in different directions from the apex 53 toward the upper end of the frame 51. Thus, each inclined face 54 is triangular in a plan view and a side view. In this manner, the four inclined faces 54 extend diagonally upward toward the apex 53 from the upper end of the frame 51 at each of the four sides of the wiring substrate 30. As illustrated in FIG. 1, each of the inclined faces 54 is inclined at a fixed angle θ1 with respect to the upper surface 30A of the wiring substrate 30. Further, as illustrated in FIGS. 2 and 3, the four inclined faces 54 are formed integrally and continuously with one another. That is, the adjacent inclined faces 54 are directly connected to each other. The upper ends of the boundaries, or edges 54A, of adjacent inclined faces 54 are connected to the apex 53. Thus, the roof 52 is formed so that the four edges 54A intersect at the apex 53.

In this manner, the roof 52 includes four triangular inclined faces 54 that are connected to form a square pyramid. The inclined faces 54 close the area above the semiconductor element 40. In other words, the portions of the roof 52 overlapped with the semiconductor element 40 in a plan view are all one of the inclined faces 54 that are inclined with respect to the upper surface 30A of the wiring substrate 30 and an upper surface of the semiconductor element 40.

With reference to FIG. 1, angle θ1 represents the angle between each inclined face 54 and a hypothetical line V1, which is parallel to the upper surface 30A of the wiring substrate 30. The angle θ1 is set in the range of, preferably, 5° to 55° (more preferably, 5° to 45°). The magnetic shielding effect can be improved by setting the angle θ1 in such a range. To reduce the thickness of the semiconductor device 20, it is preferred that the angle θ1 be set in the range of 5° to 20°.

The magnetic shield 50 may be manufactured by, for example, stamping, forging, or machining a plate of a soft magnetic material. Here, the apex 53 and the four edges 54A (refer to FIG. 2) may be rounded or chamfered depending on the processing accuracy.

The thermal conductor 60 is located between the magnetic shield 50 and the back surface (here, upper surface) of the semiconductor element 40, which is opposite to the circuit formation surface of the semiconductor element 40. The thermal conductor 60, for example, occupies the void between the back surface of the semiconductor element 40 and the lower surfaces of the inclined faces 54. The thermal conductor 60 may be indium (In), silicon (or hydrocarbon) grease, or an organic resin bonder including a substance having high thermal conductivity such as a metal filler or graphite. The thermal conductor 60 thermally couples the semiconductor element 40 to the magnetic shield 50. Thus, the thermal conductor 60 releases the heat generated by the semiconductor element 40 from the magnetic shield 50. By forming the magnetic shield 50 from an electrically conductive soft magnetic material, the magnetic shield 50 functions as a heat dissipation plate in a desirable manner. When the magnetic shield 50 is relatively thick (e.g., approximately 0.1 mm to 5 mm), the functions of the magnetic shield 50 as a heat dissipation plate may be further improved.

The operation of the semiconductor device 20 will now be described.

In contrast with the magnetic shield 50 described above, when a roof of a magnetic shield is located above the semiconductor element 40 parallel to the upper surface 30A of the wiring substrate 30, the external magnetic field orthogonally applied to the upper surface 30A of the wiring substrate 30 theoretically penetrates the magnetic shield and reaches the vicinity of the semiconductor element 40.

Figure 4:
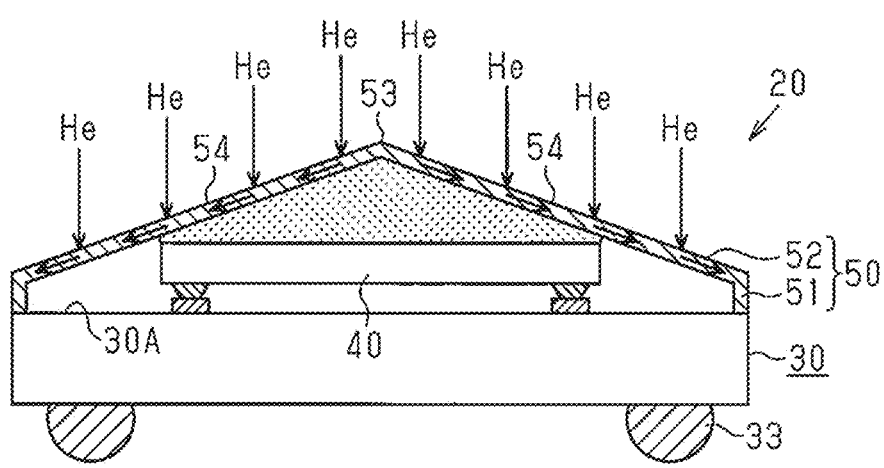
FIG. 4 is a schematic diagram illustrating the operation of the semiconductor device illustrated in FIG. 1.

In the semiconductor device 20, the roof 52 of the magnetic shield 50, which covers the upper side of the semiconductor element 40, has the form of a square pyramid. Further, the portions of the roof 52 located above the semiconductor element 40 are all one of the inclined faces 54, which are inclined straight with respect to the upper surface 30A of the wiring substrate 30. Accordingly, the roof 52 located above the semiconductor element 40 is not parallel to the upper surface 30A of the wiring substrate 30. The semiconductor element 40 is mounted on the wiring substrate 30 so that the circuit formation surface is generally parallel to the upper surface 30A of the wiring substrate 30. Thus, the inclined faces 54 that are inclined straight with respect to the upper surface 30A of the wiring substrate 30 are also inclined straight with respect to the circuit formation surface of the semiconductor element 40. Accordingly, the roof 52 located above the semiconductor element 40 is not parallel to the circuit formation surface of the semiconductor element 40. Consequently, as illustrated in FIG. 4, an external magnetic field He extending in a direction orthogonal to the upper surface 30A of the wiring substrate 30 and the circuit formation surface of the semiconductor element 40 is not orthogonal to the surface of the magnetic shield 50 throughout the entire roof 52, which covers the upper side of the semiconductor element 40. Thus, most of the flux of the external magnetic field He is absorbed by the magnetic shield 50, which has a high magnetic permeability, without penetrating the magnetic shield 50 and guided through a magnetic path formed in the magnetic shield 50 and out of the magnetic shield 50. That is, a magnetic path formed in the magnetic shield 50 deflects the magnetic flux of the external magnetic field He out of the semiconductor device 20 (magnetic shield 50) and away from the semiconductor element 40 in a plan view. This reduces the flux of the external magnetic field He reaching the inside of the magnetic shield 50 and thereby reduces the flux of the external magnetic field He reaching the vicinity of the semiconductor element 40.

Further, each inclined face 54 of the magnetic shield 50 is inclined straight at the fixed angle θ1 with respect to the upper surface 30A of the wiring substrate 30 in a cross-sectional view. Thus, in contrast with a dome-shaped magnetic shield, that is, a magnetic shield that is arcuate in a cross-sectional view, the magnetic shield 50 hardly includes any generally horizontal surface (i.e., surface generally parallel to upper surface of wiring substrate 30 and circuit formation surface of semiconductor element 40) above the semiconductor element 40. More specifically, when a magnetic shield is semi-oval in a cross-sectional view, the peak of the magnetic shield is a generally horizontal surface, whereas the peak of the magnetic shield 50 is the apex 53. Accordingly, the magnetic shield 50 does not include a generally horizontal surface even at its peak. Thus, in contrast with a dome-shaped magnetic shield, the magnetic shield 50 reduces the flux of the external magnetic field He that reaches the vicinity of the semiconductor element 40. In this manner, since the roof 52 of the magnetic shield 50 has the form of a square pyramid, the magnetic shielding effect may be further improved.

[First Simulation Results]

Simulation results that will now be described indicate that the magnetic shielding effect is improved due to the roof 52 of the magnetic shield 50 that has the form of a square pyramid.

[Simulation Conditions]

FIGS. 5A to 5C illustrate simulations that were performed on three types of samples. FIG. 5A illustrates the sample of a first example including a magnetic shield 50A that has the same structure as the magnetic shield 50. The magnetic shield 50A includes the frame 51 and the roof 52, which has the form of a square pyramid. However, to simplify the simulation conditions, the wiring substrate 30, the semiconductor element 40, and the thermal conductor 60 were omitted from the sample of the first example. Further, the magnetic shield 50A includes a bottom surface. FIG. 5B illustrates a sample of a first comparative example including a box-shaped magnetic shield 50B. FIG. 5C illustrates a sample of a second comparative example that includes a dome-shaped magnetic shield 50C.

The simulation conditions were such that the magnetic shield 50A had a width D1 set to 30 mm, a width D2 from the apex 53 to the frame 51 set to 15 mm, a height H1 of the frame 51 set to 1.5 mm, and a height H2 from the upper end of the frame 51 to the apex 53 set to 1.45 mm. The magnetic shield 50B had a width D3 that was the same as the width D1 (here, 30 mm), and the magnetic shield 50B had a height H3 that was the same as height H1 (here, 1.5 mm). The magnetic shield 50C had a size set to allow the box-shaped magnetic shield 50B (height H3) to be contained in the magnetic shield 50C. Further, the magnetic shield 50C had an inner apex set to have a height obtained by adding the height H3 and a projection amount H4. The projection amount H4 was set to have the same value as the height H2. The magnetic shield 50C had a width D4 set to 35 mm and thus a projection amount H4 adjusted to 1.45 mm. For each of the magnetic shields 50A, 50B, and 50C, a relative magnetic permeability was set to 4700, the saturated flux density was set to 0.6 T, and the electric conductivity was set to 6250000 S/m. The magnetic shields 50A, 50B, and 50C each had a thickness set to 0.1 mm and were each formed to have a hollow structure. The external magnetic field He was applied to each of the magnetic shields 50A, 50B, and 50C in a direction orthogonal to the bottom surface of each of the magnetic shields 50A, 50B, and 50C. Under such simulation conditions, the magnetic field strength was measured in the inner voids S1, S2, and S3 of the magnetic shields 50A, 50B, and 50C. FIGS. 6A to 6C illustrate the measurement results.

As apparent from the results illustrated in FIGS. 6A to 6C, compared with the sample of the first comparative example, the magnetic strengths were smaller in the inner voids S1 and S3 of the sample of the first example and the sample of the second comparative example. Further, compared with the sample of the second comparative example, the magnetic strength was smaller in the inner void S1 of the sample of the first example. In particular, compared with the sample of the second comparative example, the magnetic strength at the vicinity of the centroid C1 of the inner void S1 and above the centroid C1 was smaller in the sample of the first example. This is because the magnetic shield 50A in the sample of the first example does not include a generally horizontal surface above the centroid C1.

The above results illustrate that the magnetic shield 50A including the roof 52 having the form of a square pyramid (first example), that is, the magnetic shield 50 illustrated in FIGS. 1 to 4, has a stronger magnetic shielding effect than the box-shaped magnetic shield 50B (first comparative example) and the dome-shaped magnetic shield 50C (second comparative example). The magnetic shielding effect of the magnetic shield 50A (50) is not limited to only when an external magnetic field is applied orthogonally to the bottom surface of the magnetic shield 50A (circuit formation surface of semiconductor element 40). In other words, the magnetic shields 50 and 50A including the roof 52 that has the form of a square pyramid produces a magnetic shielding effect that acts uniformly in all directions.

As illustrated in FIGS. 5A and 5C, in the magnetic shield 50A and the magnetic shield 50C, the height H2 and the projection amount H4 are set to have the same value. Thus, even if the projection amount H4 were set to be smaller than the height H2, the magnetic shield 50A would obtain the same magnetic shielding effect as the magnetic shield 50C. Accordingly, the roof 52 that has the form of a square pyramid reduces the thickness of the entire semiconductor device 20 as compared with when using the dome-shaped magnetic shield 50C.

[Second Simulation Results]

Simulation results representing the relationship of the angle θ1 of the magnetic shield 50 and the magnetic shielding effect will now be described.

[Simulation Conditions]

Figure 7:
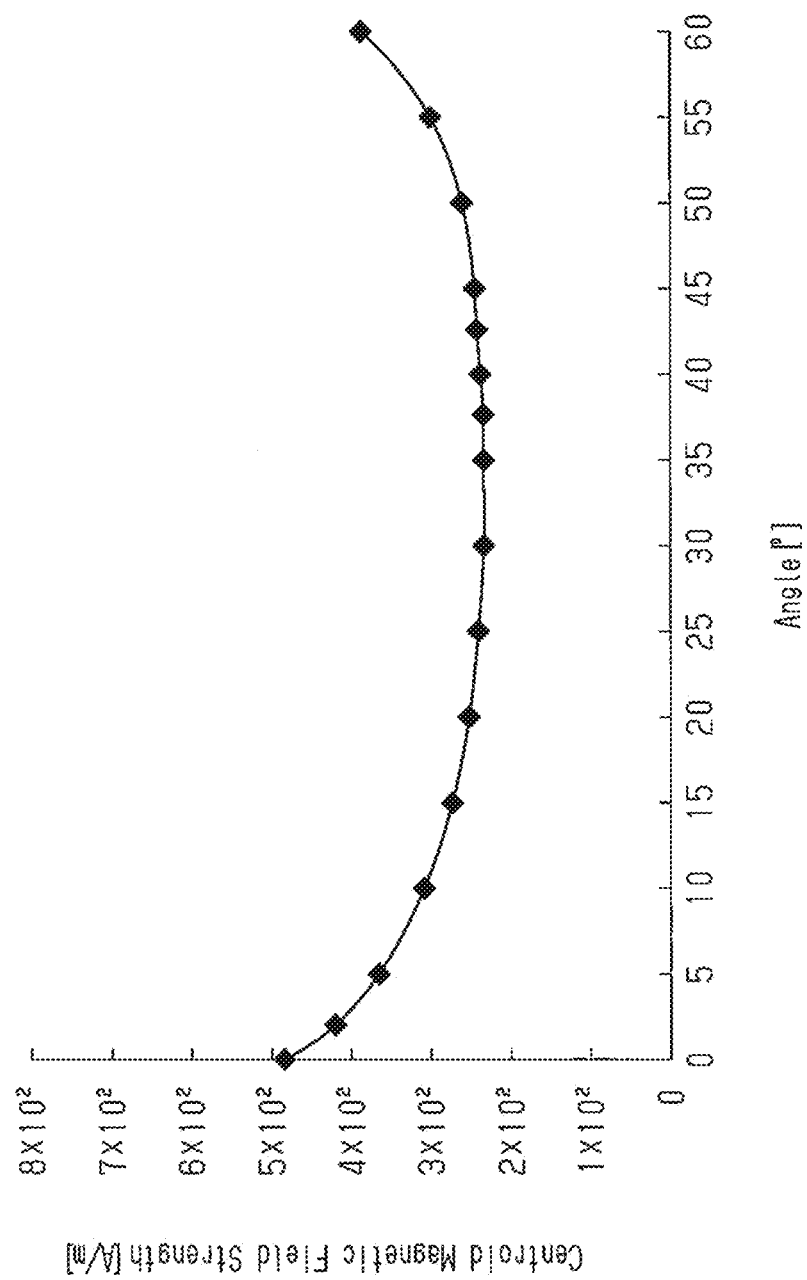
FIG. 7 is a graph illustrating the angle dependence of the magnetic shielding effect.

Fourteen types of evaluation samples were prepared. Each sample had the same structure as the magnetic shield 50A illustrated in FIG. 5A. Further, for each sample, the width D1 was set to 30 mm, the width D2 was set to 15 mm, and the height H1 was set to 3 mm. The angle θ1 of the roof 52 was set in the fourteen samples (magnetic shields 50A) respectively to 0 degrees, 2 degrees, 5 degrees, 10 degrees, 15 degrees, 20 degrees, 25 degrees, 30 degrees, 35 degrees, 40 degrees, 45 degrees, 50 degrees, 55 degrees, and 60 degrees. For the magnetic shield 50A of each of the samples, the relative magnetic permeability was set to 4700, the saturated flux density was set to 0.6 T, and the electric conductivity was set to 6250000 S/m. Further, the magnetic shield 50A of each of the samples was set to have a thickness of 0.1 mm, and each magnetic shield 50A had a hollow structure. The external magnetic field He was applied orthogonally to the bottom surface of the magnetic shield 50A in each sample. Under such simulation conditions, the magnetic field strength at the centroid C1 of the inner void S1 in each magnetic shield 50A was measured. FIG. 7 illustrates the measurement results.

FIG. 7 is a graph illustrating the angle dependence of the magnetic shielding effect. The vertical axis represents the magnetic field strength A/m at the centroid C1 of each sample, and the horizontal axis represents angle θ1. The angle θ1 of 0° corresponds to the magnetic shield 50B (sample of first comparative example) illustrated in FIG. 5B.

As apparent from the results illustrated in FIG. 7, the magnetic shielding effect can be increased by inclining the roof 52 of the magnetic shield 50A. When the angle θ1 was 2°, the magnetic field strength was decreased by only approximately 13% from when the angle θ1 was 0°. Thus, the magnetic shielding effect was insufficient. In contrast, when the angle θ1 was 5°, the magnetic field strength was decreased by approximately 25% from when the angle θ1 was 0°. Thus, a high magnetic shielding effect was obtained. Accordingly, a high magnetic shielding effect may be obtained by setting the angle θ1 to 5° or greater. Further, when the angle θ1 was in the range of 20° to 45°, the magnetic field strength was decreased by approximately 50% from when the angle θ1 was 0°. However, the magnetic shielding effect gradually decreased when the angle θ1 became too large (e.g., when the angle θ1 was 50° or greater). In particular, when the angle θ1 was 60° or greater, the magnetic shielding effect was lower than when the angle θ1 was 5°.

To improve the magnetic shielding effect, the above results indicate that it is preferred that the angle θ1 of the magnetic shield 50 be in the range of 5° to 55° and more preferred that the angle θ1 be in the range of 5° to 45°.

As illustrated in FIG. 5A, the height H2 increases as the angle θ1 increases. Thus, an increase in the angle θ1 would enlarge the magnetic shield 50A (magnetic shield 50). This, in turn, would enlarge the entire semiconductor device 20. In this regard, the magnetic shielding effect remains substantially the same when the angle θ1 is in the range of 20° to 45°. Accordingly, it is preferred that the angle θ1 of the magnetic shield 50 be set in the range of 5° to 20° to improve the magnetic shielding effect and reduce the thickness of the semiconductor device 20.

The present embodiment has the advantages described below.

(1) The magnetic shield 50 (roof 52) includes the inclined faces 54 inclined straight with respect to the upper surface 30A of the wiring substrate 30 at a portion overlapped with the semiconductor element 40 in a plan view. This structure improves the magnetic shielding effect and reduces the influence of an external magnetic field on the semiconductor element 40. Thus, even when the semiconductor element 40 is, for example, an MRAM chip that is susceptible to the influence of an external magnetic field, situations can be reduced in which an external magnetic field acts to delete or rewrite the stored contents.

(2) In the dome-shaped magnetic shield 50C, when the projection amount H4 (refer to FIG. 5C) is small, the generally horizontal surface above the semiconductor element 40 increases and drastically decreases the magnetic shielding effect. In contrast, the magnetic shield 50 includes the inclined faces 54 that are inclined straight with respect to the upper surface 30A of the wiring substrate 30. Thus, even when decreasing the height H2 from the upper end of the frame 51 to the apex 53 in the magnetic shield 50, the inclined faces 54 do not include a generally horizontal surface above the semiconductor element 40. Accordingly, even when the height H2 is decreased, the magnetic shield 50 obtains a high magnetic shielding effect.

(3) The angle θ1 of the magnetic shield 50 is set in the range of 5° to 55°. This obtains a high magnetic shielding effect. Further, enlargement of the semiconductor device 20 may be limited while obtaining a high magnetic shielding effect by setting the angle θ1 of the magnetic shield 50 in the range of 5° to 20°.

(4) The magnetic shield 50 includes the frame 51. This restricts direct contact of the magnetic shield 50 (roof 52) and the semiconductor element 40 even when setting a small angle θ1 (e.g., approximately 5°).

(5) The thermal conductor 60 thermally couples the semiconductor element 40 and the magnetic shield 50. Further, the magnetic shield 50 is formed from an electrically conductive soft magnetic material (metal magnetic material) so that the magnetic shield 50 functions as a heat dissipation plate. This improves the heat dissipation of the semiconductor device 20.

It should be apparent to those skilled in the art that the present invention may be embodied in many other specific forms without departing from the spirit or scope of the invention. Particularly, it should be understood that the present invention may be embodied in the following forms.

Figure 8:
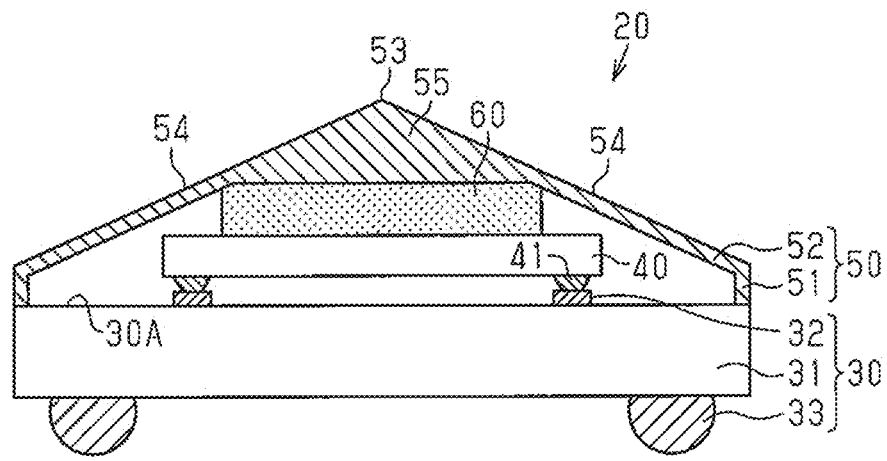
FIGS. 8 and 9 are schematic cross-sectional views illustrating various modifications of the semiconductor device.

As illustrated in FIG. 8, the magnetic shield 50 may be increased in thickness below the apex 53. More specifically, the magnetic shield 50 may include a thick portion 55 that partially occupies upper inner void encompassed by the roof 52. In the example illustrated in FIG. 8, the thick portion 55 is defined by a polygonal pyramid (here, square pyramid) that partially occupies the upper inner void, which is triangular in a cross-sectional view. The four inclined faces 54 extend from the lower rim of the thick portion 55 (square pyramid) toward the upper surface 30A of the wiring substrate 30. The thick portion 55 is also formed from a soft magnetic material. The thick portion of the magnetic shield 50 above the semiconductor element 40 further improves the magnetic shielding effect.

Figure 9:
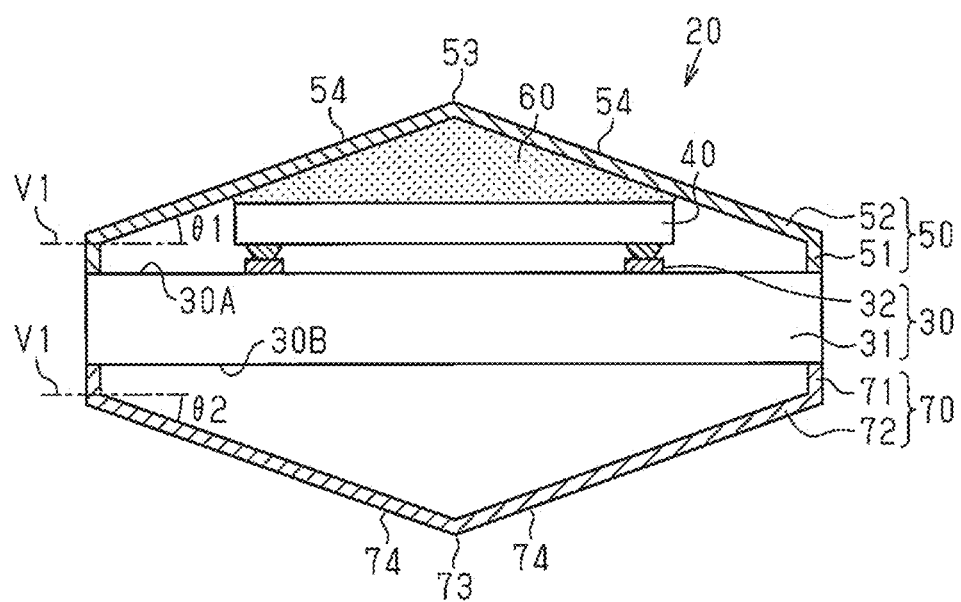

As illustrated in FIG. 9, a magnetic shield 70 formed from a soft magnetic material and having the same structure as the magnetic shield 50 may be arranged on the lower surface 30B of the wiring substrate 30. The magnetic shield 70 includes a frame 71, which is adhered to the lower surface 30B of the wiring substrate 30, and a roof 72, which is formed integrally with the frame 71. The roof 72 covers the lower side of the semiconductor element 40. The frame 71 vertically projects toward the lower side from the rim of the lower surface 30B of the wiring substrate 30. The roof 72 has the form of a square pyramid or square roofing. The roof 72 includes an apex 73 and four inclined faces 74. The apex 73 is located downward from the lower end of the frame 71 at a position non-overlapped with the frame 71 in a plan view. The four inclined faces 74 are inclined straight in different directions from the apex 73 toward the frame 71 (wiring substrate). For example, each of the inclined faces 74 is inclined at a fixed angle θ2 with respect to the lower surface 30B of the wiring substrate 30. The magnetic shield 70 protects the semiconductor element 40 from an external magnetic field in a desirable manner even when an external magnetic field is applied to the magnetic shield 70 from the lower side of the wiring substrate 30.

[Simulation Results for Structure of FIG. 9]

Simulation results representing the relationship of the angles θ1 and θ2 of the two magnetic shields 50 and 70 and the magnetic shielding effect will now be described.

[Simulation Conditions]

Fourteen types of evaluation samples were prepared. Each sample (second example) had the same structure as the semiconductor device 20 illustrated in FIG. 9 and included the magnetic shield 50, which has the form of a square pyramid, and the magnetic shield 70, which has form of a square pyramid. However, to simplify the simulation conditions, the wiring substrate 30, the semiconductor element 40, and the thermal conductor 60 were omitted from each sample. Further, the frame 51 of the magnetic shield 50 was directly connected to the frame 71 of the magnetic shield 70.

For each sample, the width D1 in the sideward direction as viewed in FIG. 10 was set to 30 mm, and the width D2 from the apexes 53 and 73 to the frames 51 and 71 was set to 15 mm. Further, the total height H5 of the frames 51 and 71 was set to 3 mm. In each sample, the angle θ1 of the magnetic shield 50 was set to a value equal to the angle θ2 of the magnetic shield 70. The angles θ1 and θ2 were set in the fourteen samples respectively to 0 degrees, 2 degrees, 5 degrees, 10 degrees, 15 degrees, 20 degrees, 25 degrees, 30 degrees, 35 degrees, 40 degrees, 45 degrees, 50 degrees, 55 degrees, and 60 degrees. For the magnetic shields 50 and 70, the relative magnetic permeability was set to 4700, the saturated flux density was set to 0.6 T, and the electric conductivity was set to 6250000 S/m. Further, the magnetic shields 50 and 70 were each set to have a thickness of 0.1 mm, and the magnetic shields 50 and 70 each had a hollow structure. The external magnetic field He was applied to the magnetic shields 50 and 70 in each sample. Under such simulation conditions, the magnetic field strength at the centroid C4 of the inner void S4 in the two magnetic shields 50 and 70 was measured. FIG. 11 illustrates the measurement results.

FIG. 11 is a graph illustrating the angle dependence of the magnetic shielding effect of the magnetic shields 50 and 70. The vertical axis represents the magnetic field strength A/m at the centroid C4 of the inner void S4, and the horizontal axis represents angles θ1 and θ2. FIG. 11 illustrates the magnetic shield effect of the samples of the second example illustrated in FIG. 10. In addition, FIG. 11 illustrates the magnetic shield effect of the samples of the first example that includes only the magnetic shield 50A (refer to FIG. 5A). The angles θ1 and θ2 of 0° correspond to the magnetic shields 50 and 70 that are both box-shaped.

As apparent from the results illustrated in FIG. 11, the magnetic shielding effect can be increased by inclining the roofs 52 and 72 of the magnetic shields 50 and 70. More specifically, when the angles θ1 and θ2 were 5°, the magnetic field strength was decreased by approximately 40% from when the angles θ1 and θ2 were 0°. Thus, a high magnetic shielding effect was obtained. Accordingly, a high magnetic shielding effect may be obtained by setting the angles θ1 and θ2 to 5° or greater. However, the magnetic shielding effect gradually decreased when the angles θ1 and θ2 became too large (e.g., when the angles θ1 and θ2 were 45° or greater). In particular, when the angles θ1 and θ2 were 60° or greater, the magnetic shielding effect was lower than when the angles θ1 and θ2 were 5°.

To improve the magnetic shielding effect, the above results indicate that it is preferred that the angles θ1 and θ2 of the magnetic shield 50 be in the range of 5° to 55° and more preferred that the angles θ1 and θ2 be in the range of 5° to 45°. Further, when the angles θ1 and θ2 are in the range of 5° to 55°, the magnetic field strength is lower in the samples of the second example than in the samples of the first example. This result indicates that the magnetic shield 70 improves the magnetic shielding effect.

In the above embodiment, each of the wiring substrate 30 and the semiconductor element 40 is generally square in a plan view. However, the planar shapes of the wiring substrate 30 and the semiconductor element 40 are not particularly limited.

Figure 12A:
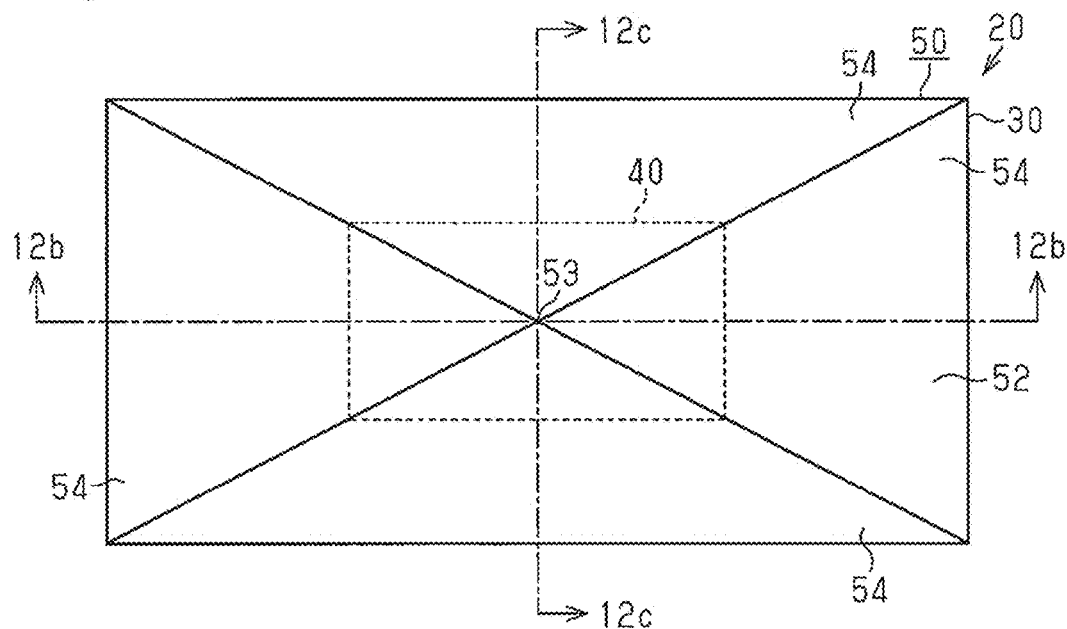
FIG. 12A is a schematic plan view illustrating a further modification of the semiconductor device.
Figure 12B:
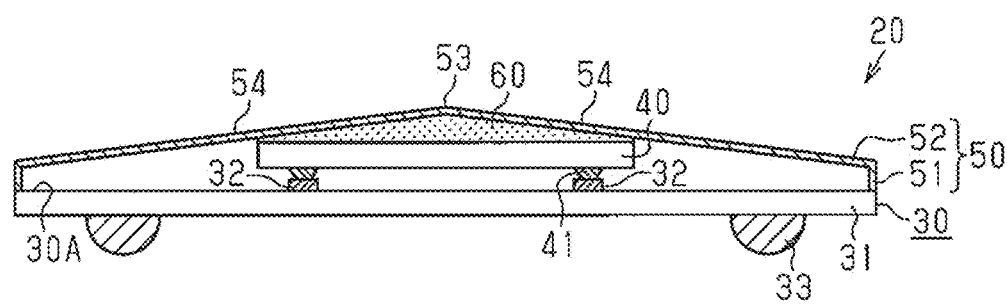
FIG. 12B is a cross-sectional view taken along line 12b-12b in FIG. 12A.
Figure 12C:
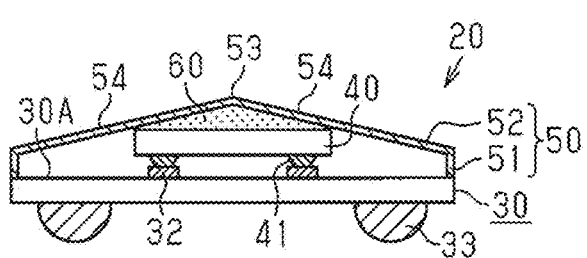
FIG. 12C is a cross-sectional view taken along line 12c-12c in FIG. 12A.

For example, as illustrated in FIG. 12A, the wiring substrate 30 and the semiconductor element 40 may each be rectangular in a plan view. In this case, as illustrated in FIGS. 12A to 12C, the roof 52 of the magnetic shield 50 may be a rectangular pyramid. This structure also includes the apex 53 and the four triangular inclined faces 54, which extend between the apex 53 and the frame 51. More specifically, the magnetic shield 50 includes the inclined faces 54, which are inclined straight with respect to the upper surface of the wiring substrate 30 at portions overlapped with the semiconductor element 40 in a plan view. Accordingly, the semiconductor device 20 illustrated in FIGS. 12A to 12C have the same advantages as the semiconductor device 20 illustrated in FIGS. 1 to 4.

The roof 52 of the magnetic shield 50 does not have to be a square pyramid and may be any polygonal pyramid such as a triangular pyramid, a pentagonal pyramid, or a hexagonal pyramid.

Figure 13A:
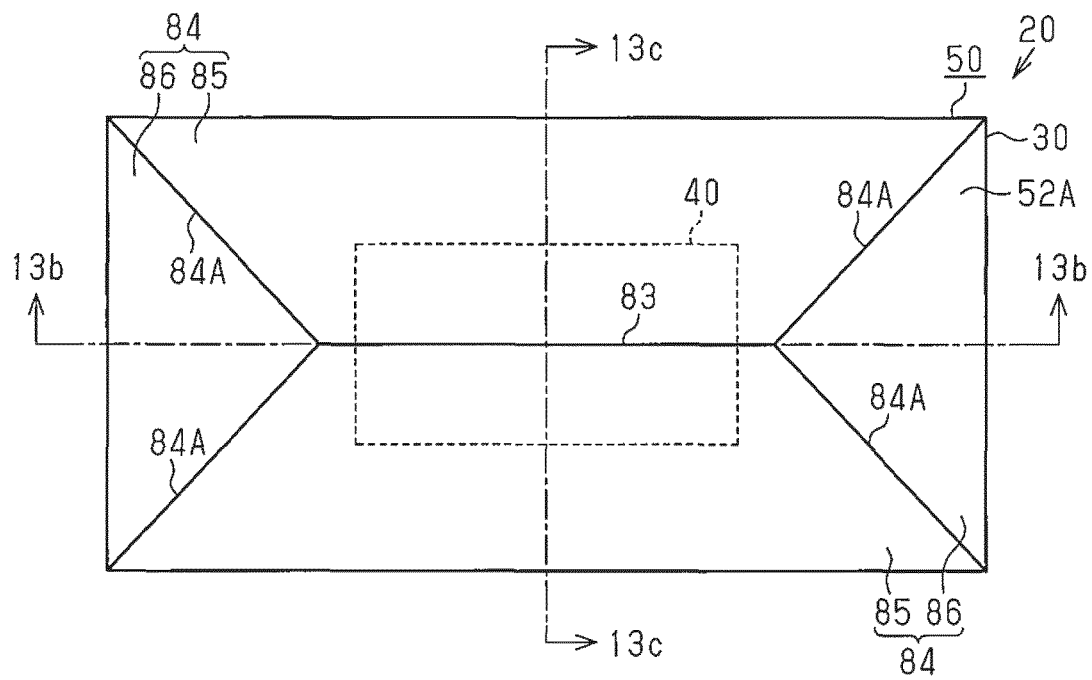
FIG. 13A is a schematic plan view illustrating another modification of the semiconductor device.
Figure 13B:
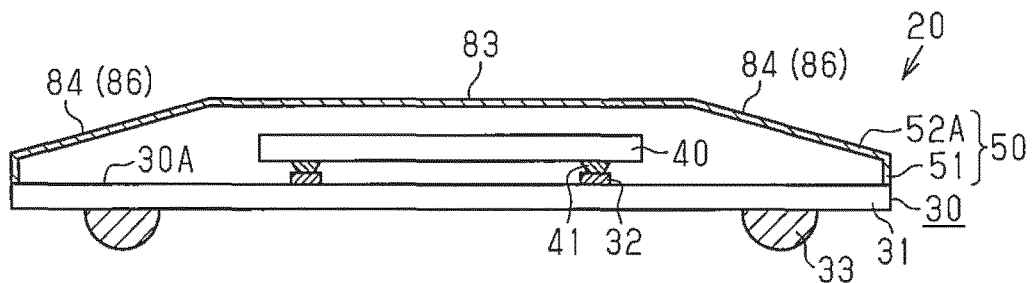
FIG. 13B is a cross-sectional view taken along line 13b-13b in FIG. 13A.
Figure 13C:
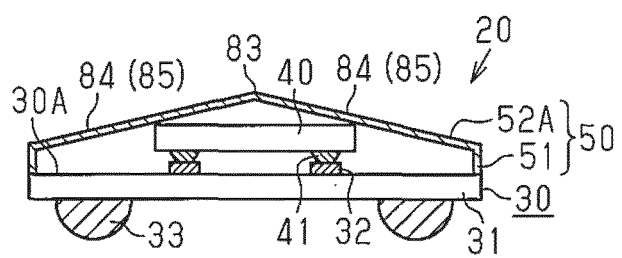
FIG. 13C is a cross-sectional view taken along line 13c-13c in FIG. 13A.

As illustrated in FIGS. 13A to 13C, the magnetic shield 50 may include a roof 52A having the form of a hip roof. The roof 52A includes a top edge 83 and four inclined faces 84. The top edge 83 is located upward from the upper end of the frame 51 at a position non-overlapped with the frame 51 in a plan view. The four inclined faces 84 are inclined straight from the top edge 83 toward the upper end of the frame 51 (wiring substrate 30). Two of the four inclined faces 84 are trapezoidal inclined faces 85, which are trapezoidal in a plan view, and the other two are triangular inclined faces 86, which are triangular in a plan view. Each trapezoidal inclined face 85 projects diagonally upward to the top edge 83 from the upper end of the frame 51 at a portion located on a long side of the wiring substrate 30. Each triangular inclined face 86 projects diagonally upward to the left end (or right end) of the top edge 83 from the upper end of the frame 51 at a portion located on a short side of the wiring substrate 30. The four inclined faces 84 are connected into the form of a hip roof with the two trapezoidal inclined faces 85 facing each other and the two triangular inclined faces 86 facing each other. More specifically, the right end of the top edge 83 intersects two edges 84A, and the left end of the top edge 83 intersects the other two edges 84A. Each inclined face 84 is inclined straight at a fixed angle with respect to the upper surface 30A of the wiring substrate 30.

In this case, the magnetic shield 50 is also inclined straight with respect to the upper surface 30A of the wiring substrate 30 at portions overlapped with the semiconductor element 40 in a plan view and thus has the same advantages as the above embodiment. Further, the peak of the magnetic shield 50 is defined by the top edge 83. Thus, when the inclined faces 84 are set to have the same inclination angle, the peak may be located at a lower position than when the peak is a point. Accordingly, the magnetic shield 50 including the roof 52A that has the form of a hip roof allows the semiconductor device 20 to be entirely reduced in thickness.

There is no limit to the number of semiconductor elements 40 that can be mounted on the wiring substrate 30 of the above embodiment. For example, two or more semiconductor elements 40 may be mounted on the upper surface 30A of the wiring substrate 30. In this case, the magnetic shield 50 may be formed to cover all of the semiconductor elements 40 mounted on the upper surface 30A of the wiring substrate 30. Further, the semiconductor elements 40 may be mounted on the lower surface 30B of the wiring substrate 30. In this case, it is preferred that the magnetic shield 70 (refer to FIG. 9) be formed to cover the semiconductor elements 40 mounted on the upper surface 30A of the wiring substrate 30 from beside and below.

Figure 14A:
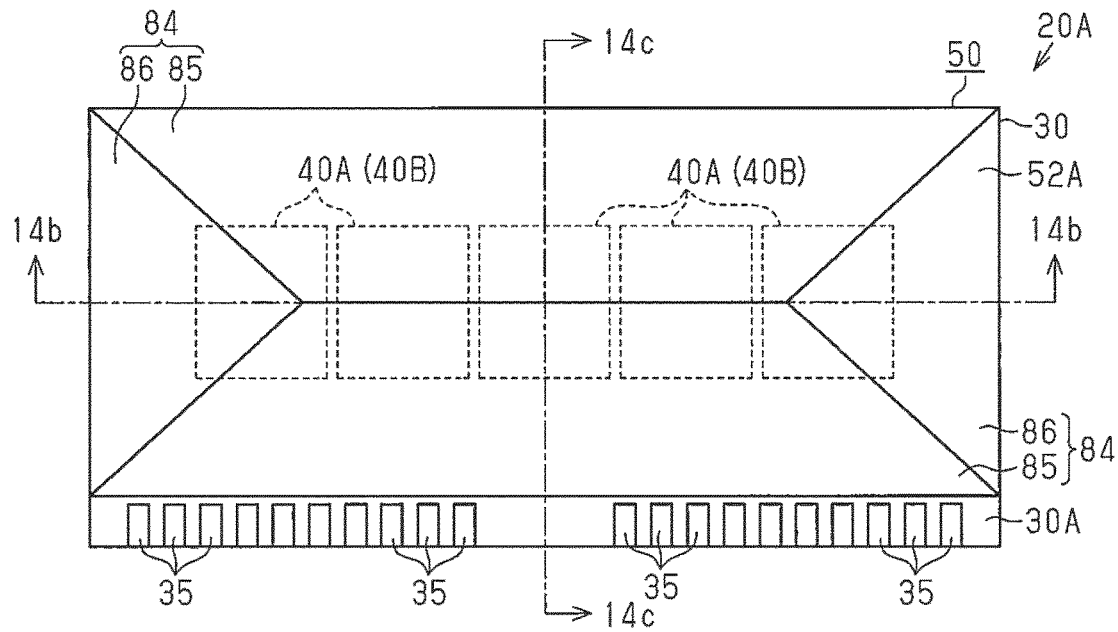
FIG. 14A is a schematic plan view illustrating a further modification of the semiconductor device.
Figure 14B:
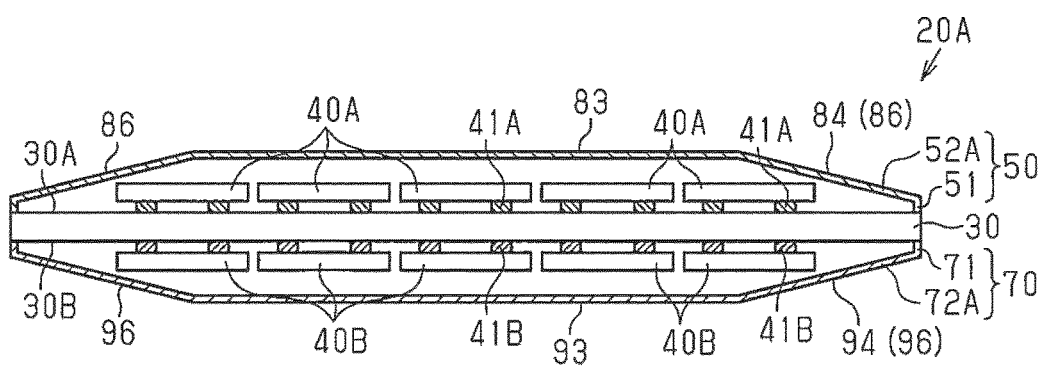
FIG. 14B is a cross-sectional view taken along line 14b-14b in FIG. 14A.
Figure 14C:
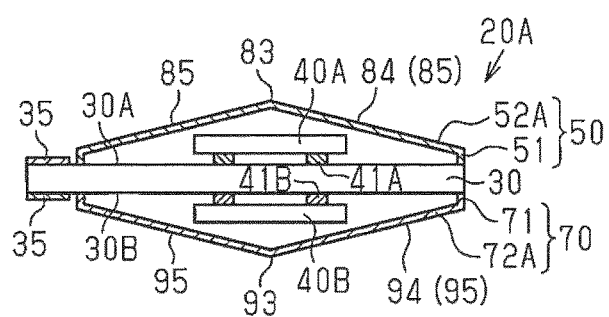
FIG. 14C is a cross-sectional view taken along line 14c-14c in FIG. 14A.

FIGS. 14A to 14C illustrate an example of the magnetic shields 50 and 70 applied to a memory module (semiconductor device).

As illustrated in FIGS. 14A to 14C, the semiconductor device 20A includes the wiring substrate 30, which is rectangular in a plan view, a plurality of (here, five) semiconductor elements 40A, which are mounted on the upper surface 30A of the wiring substrate 30, and a plurality of (here, five) semiconductor elements 40B, which are mounted on the lower surface 30B of the wiring substrate 30. The five semiconductor elements 40A are laid out in the longitudinal direction of the wiring substrate 30 on the upper surface 30A of the wiring substrate 30. Each semiconductor element 40A is electrically connected by connection terminals 41A to the wiring substrate 30. In the same manner, the five semiconductor elements 40B are laid out in the longitudinal direction of the wiring substrate 30 on the lower surface 30B of the wiring substrate 30. Each semiconductor element 40B is electrically connected by connection terminals 41B to the wiring substrate 30. Each of the semiconductor elements 40A and 40B is, for example, an MRAM chip or a memory chip.

Further, the semiconductor device 20A includes the magnetic shield 50, which is arranged on the upper surface 30A of the wiring substrate 30 to cover every one of the semiconductor elements 40A, and the magnetic shield 70, which is arranged on the lower surface 30B to cover every one of the semiconductor elements 40B. The magnetic shield 50, which has the same structure as the magnetic shield 50 illustrated in FIGS. 13A to 13C, includes the frame 51 and a roof 52A, which has the form of a hip roof.

In the same manner, the magnetic shield 70 includes the frame 71 and the roof 72A, which has the form of a hip roof. The roof 72A includes a top edge 93 and four inclined faces 94. The top edge 93 is located downward from the lower end of the frame 71 at a position non-overlapped with the frame 71 in a plan view. The four inclined faces 94 are inclined straight from the top edge 93 toward the upper end of the frame 71 (wiring substrate 30). Two of the four inclined faces 94 are trapezoidal inclined faces 95, which are trapezoidal in a plan view, and the other two are triangular inclined faces 96, which are triangular in a plan view. Each trapezoidal inclined face 85 projects diagonally upward to the top edge 83 from the upper end of the frame 71 at a portion located on a long side of the wiring substrate 30. The four inclined faces 94 are connected into the form of a hip roof with the two trapezoidal inclined faces 95 facing each other and the two triangular inclined faces 96 facing each other.

One side of the upper surface 30A and one side of the lower surface 30B extending in the longitudinal direction of the wiring substrate 30 extend out of the magnetic shields 50 and 70. Connection terminals 35 are formed on the one side of the upper surface 30A and the one side of the lower surface 30B. The connection terminals 35 are laid out in the longitudinal direction of the wiring substrate 30.

In this case, the magnetic shields 50 and 70 are inclined straight with respect to the upper surface 30A and the lower surface 30B of the wiring substrate 30 at portions overlapped with the semiconductor elements 40A and 40B in a plan view and thus have the same advantages as the above embodiment.

In the modification illustrated in FIGS. 14A to 14C, each semiconductor element 40A is one example of a first semiconductor element, each semiconductor element 40B is one example of a second semiconductor element, the magnetic shield 50 is one example of a first magnetic shield, and the magnetic shield 70 is one example of a second magnetic shield.

In the semiconductor device 20A illustrated in FIGS. 14A to 14C, the semiconductor elements 40A and 40B are laid out in the longitudinal direction of the wiring substrate 30. Instead, for example, the semiconductor elements 40A and 40B may be laid out in the lateral direction of the wiring substrate 30. Further, the semiconductor elements 40A and 40B may be laid out in a matrix array.

In the semiconductor device 20 illustrated in FIGS. 13A and 13B and the semiconductor device 20A illustrated in FIGS. 14A to 14C, the thermal conductor 60 may be arranged between the semiconductor elements 40 and 40A and the magnetic shield 50 and between the semiconductor elements 40B and the magnetic shield 70.

In the above embodiment, the frame 51 may be omitted. In this case, for example, the lower end of the roof 52 may be adhered with an adhesive agent (not illustrated) to the upper surface 30A of the wiring substrate 30.

In the above embodiment, the thermal conductor 60 may be omitted.

In the above embodiment, the inner void encompassed by the magnetic shield 50 may be filled with resin.

Figure 15:
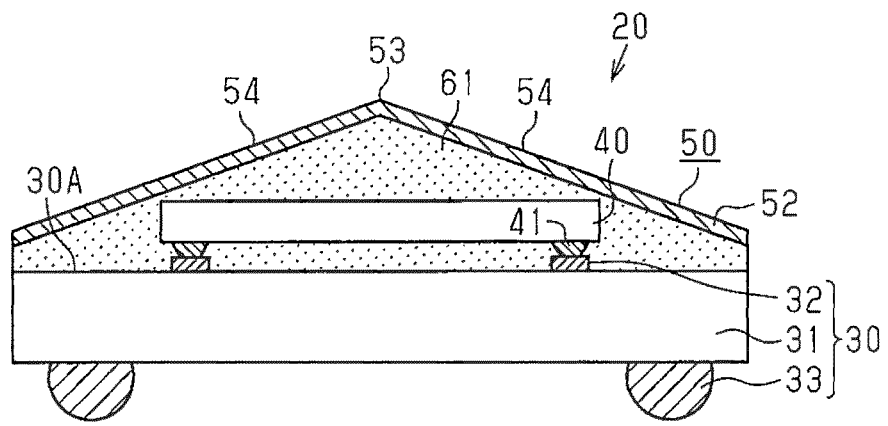
FIGS. 15 and 16 are schematic cross-sectional views illustrating various modifications of the semiconductor device.

In the above embodiment, the magnetic shield 50 is adhered to the upper surface 30A of the wiring substrate 30. Instead, for example, as illustrated in FIG. 15, an encapsulation resin that encapsulates the semiconductor element 40 may be formed on the upper surface 30A of the wiring substrate 30, and the magnetic shield 50 may be formed on the upper surface of the encapsulation resin 61. In this case, the upper portion of the encapsulation resin 61 is shaped to have, for example, the form of a square pyramid. Further, the magnetic shield 50 including the roof 52, which has the form of a square pyramid, is arranged above the encapsulation resin 61. In other words, the magnetic shield 50 may be directly or indirectly arranged on the upper surface 30A of the wiring substrate 30 to cover the upper side of the semiconductor element 40. The encapsulation resin 61 may be formed from, for example, an epoxy resin or a polyimide resin.

In the above embodiment, the method for mounting the semiconductor element 40 is not particularly limited. For example, the semiconductor element 40 may be wire-bonded to the wiring substrate 30.

In the above embodiment, electronic components other than the semiconductor element 40 may be mounted on the wiring substrate 30.

In the above embodiment, the magnetic shields 50 and 70 are applied to a BGA type wiring substrate 30. However, the magnetic shields 50 and 70 may be applied to a pin grid array (PGA) type wiring substrate or a land grid array (LGA) type wiring substrate. Further, the magnetic shield 50 may be applied to a quad flat package (QFP) type semiconductor device. In this case, the magnetic shield 50 is arranged on the upper surface of a lead frame, and the magnetic shield 50 is formed from an insulative soft magnetic material. Alternatively, the magnetic shield 50 may be formed by a metal soft magnetic material and be covered by an insulator. When applied to a QFP type semiconductor device, the magnetic shield 70 may be arranged on the lower surface of a lead frame.

Figure 16:
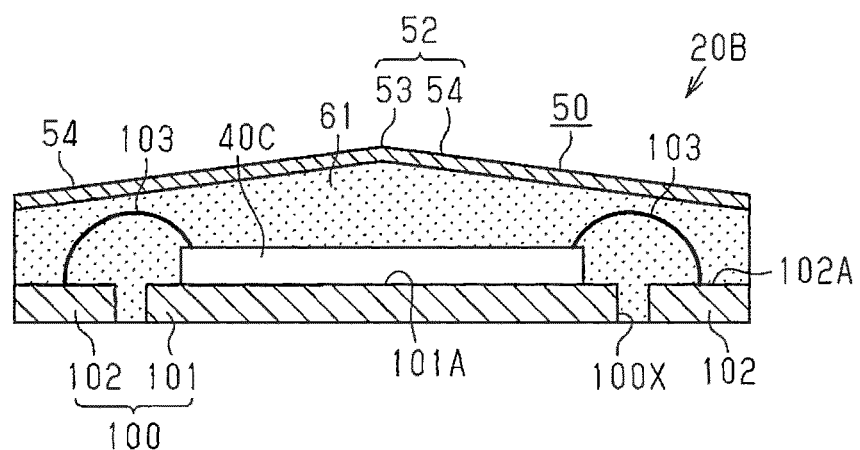

As illustrated in FIG. 16, the magnetic shield 50 may be applied to a quad flat non-leaded (QFN) type semiconductor device 20B. The semiconductor device 20B includes a lead frame 100 and a semiconductor element 40C. The lead frame 100 includes a die pad 101 and leads 102, which are arranged around the die pad 101. The semiconductor element 40C is mounted on the upper surface 101A of the die pad 101. The die pad 101 and the leads 102 are defined by openings 100X extending through the lead frame 100 in the thickness-wise direction. The lead frame 100 is obtained by etching or stamping a metal plate formed from a copper alloy, an iron-nickel (Fe—Ni) alloy, or the like. The semiconductor element 40C, which includes a circuit formation surface (here, upper surface), is mounted on the die pad 101 so that the surface (here, lower surface) opposite to the circuit formation surface faces the upper surface 101A of the die pad 101. That is, the semiconductor element 40C is mounted faced up on the die pad.

Further, the semiconductor device 20B includes bonding wires 103, which electrically connect electrodes (not illustrated) of the semiconductor element 40C to the leads 102, the encapsulation resin 61, which encapsulates the semiconductor element 40C and the bonding wires 103, and the magnetic shield 50, which is formed on the upper surface of the encapsulation resin 61. The bonding wires 103 may be formed from, for example, gold or copper. The encapsulation resin 61 is formed on the upper surface 101A of the die pad 101 and the upper surface 102A of each lead 102. Further, the openings 100X are filled with the encapsulation resin 61. The lower surface of the encapsulation resin 61 is generally flush with the lower surface of the die pad 101 and the lower surface of each lead 102. Thus, the lower surface of the die pad 101 and the lower surface of each lead 102 are exposed from the encapsulation resin 61. Additionally, the upper portion of the encapsulation resin 61 is shaped to have, for example, the form of a square pyramid. The magnetic shield 50 includes the roof 52 that has, for example, the form of a square pyramid, and covers the upper surface of the encapsulation resin.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the spirit and scope of the invention.

The invention claimed is:
1. A semiconductor device comprising:
a wiring substrate;
a semiconductor element mounted on an upper surface of a wiring substrate; and
a magnetic shield arranged above the upper surface of the wiring substrate to cover an upper surface of the semiconductor element, wherein
the magnetic shield is formed from a soft magnetic material, and
the magnetic shield includes inclined faces that are inclined straight with respect to the upper surface of the wiring substrate, wherein the inclined faces are overlapped with the semiconductor element in a plan view.
2. The semiconductor device according to claim 1, wherein:
the magnetic shield includes a roof that covers the upper surface of the semiconductor element; and
the roof includes
a peak that is an apex or a top edge, and three or more inclined faces that are inclined in different direction from the peak toward the upper surface of the wiring substrate.

3. The semiconductor device according to claim 2, wherein the three or more inclined faces of the roof are each a triangular inclined face and connected to one another to form a polygonal pyramid roof.

4. The semiconductor device according to claim 2, wherein the inclined faces of the roof include two trapezoidal inclined faces and two triangular inclined faces, and the two trapezoidal inclined faces and the two triangular inclined faces are connected to one another to form a hip roof.

5. The semiconductor device according to claim 2, wherein
the magnetic shield further includes a frame arranged on the upper surface of the wiring substrate, and
the three or more inclined faces extend between an upper end of the frame and the peak of the roof.

6. The semiconductor device according to claim 2, wherein an angle formed between a hypothetical line that is parallel to the upper surface of the wiring substrate and each of the three or more inclined faces is set in a range of 5° to 20°.

7. The semiconductor device according to claim 1, further comprising a thermal conductor located between the semiconductor element and the magnetic shield, wherein
the thermal conductor thermally couples the semiconductor element and the magnetic shield, and
the magnetic shield is formed from a conductive soft magnetic material.

8. The semiconductor device according to claim 1, wherein the semiconductor element serves as a first semiconductor element, and the magnetic shield serves as a first magnetic shield, the semiconductor device further comprising:
a second semiconductor element mounted on a lower surface of the wiring substrate; and
a second magnetic shield arranged below the lower surface of the wiring substrate to cover a lower surface of the second semiconductor element, wherein
the second magnetic shield is formed from a soft magnetic material, and
the second magnetic shield includes inclined faces that are inclined straight with respect to the lower surface of the wiring substrate, wherein the inclined faces of the second magnetic shield are overlapped with the second semiconductor element in a plan view.

9. The semiconductor device according to claim 2, wherein
the magnetic shield includes a thick portion that partially occupies an upper inner void encompassed by the roof, and
the three or more inclined faces extend from a lower rim of the thick portion toward the upper surface of the wiring substrate.

10. The semiconductor device according to claim 1, wherein the semiconductor element includes a magnetic random access memory or a magnetic resistance element.

11. The semiconductor device according to claim 1, wherein the soft magnetic material is selected from a group including iron, nickel, silicon steel, permalloy, ferrite, amorphous magnetic alloy, and nanocrystal magnetic alloy.

12. The semiconductor device according to claim 1, further comprising a resin arranged between the wiring substrate and the magnetic shield to encapsulate the semiconductor element.

13. The semiconductor device according to claim 1, wherein the wiring substrate is a lead frame.

* * * * *